(12) United States Patent
Yoshihara

(10) Patent No.: US 6,987,621 B2
(45) Date of Patent: Jan. 17, 2006

(54) ABERRATION CORRECTION OPTICAL SYSTEM

(75) Inventor: Toshiyuki Yoshihara, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/936,797

(22) Filed: Sep. 9, 2004

(65) Prior Publication Data

US 2005/0030638 A1    Feb. 10, 2005

Related U.S. Application Data

(62) Division of application No. 09/438,491, filed on Nov. 12, 1999.

(30) Foreign Application Priority Data

Nov. 16, 1998    (JP)    ................................. 10-342385

(51) Int. Cl.
*G02B 3/00*    (2006.01)
*G02B 9/00*    (2006.01)
*G02B 13/08*    (2006.01)

(52) U.S. Cl. ...................... 359/649; 359/668; 359/710
(58) Field of Classification Search ........ 359/649–651, 359/668, 708, 710–711, 717–718
See application file for complete search history.

(56) References Cited

U.S. PATENT DOCUMENTS 4,937,459 A * 6/1990 Ina .............................. 250/548
5,148,036 A    9/1992 Matsugu et al. ............. 250/548
5,424,552 A    6/1995 Tsuji et al. ................... 250/548
5,490,013 A    2/1996 Shimizu et al. .............. 359/637
5,557,446 A    9/1996 Kato ............................ 359/206
5,623,364 A    4/1997 Morooka ...................... 359/557
5,648,871 A    7/1997 Okuyama et al. ............ 359/557
5,963,577 A * 10/1999 Snyder et al. ............... 372/101
6,512,641 B2    1/2003 Omura ......................... 359/727
2002/0126268 A1    9/2002 Matsumoto et al. ........... 355/67
2002/0149756 A1    10/2002 Tokuda et al. ................. 355/53

FOREIGN PATENT DOCUMENTS

| EP | 0 660 169 A1 | 12/1994 |
| JP | 1-121816 | 5/1989 |
| JP | 7-183190 | 7/1995 |
| JP | 10-27743 | 1/1998 |

* cited by examiner

*Primary Examiner*—Jordan M. Schwartz
(74) *Attorney, Agent, or Firm*—Fitzpatrick, Cella, Harper & Scinto

(57) ABSTRACT

A projection system for projecting a pattern of a mask onto a substrate. The projection system includes a projection optical system disposed between the mask and the substrate, and an optical element for correcting aberration produced in the projection optical system. The optical element has different refracting powers in two orthogonal directions or has a refracting power in one direction of two orthogonal directions and no refracting power in the other of the two orthogonal directions. The optical element is disposed between the mask and the substrate. An optical axis of the optical element is inclined with respect to an optical axis of the projection optical system.

2 Claims, 5 Drawing Sheets

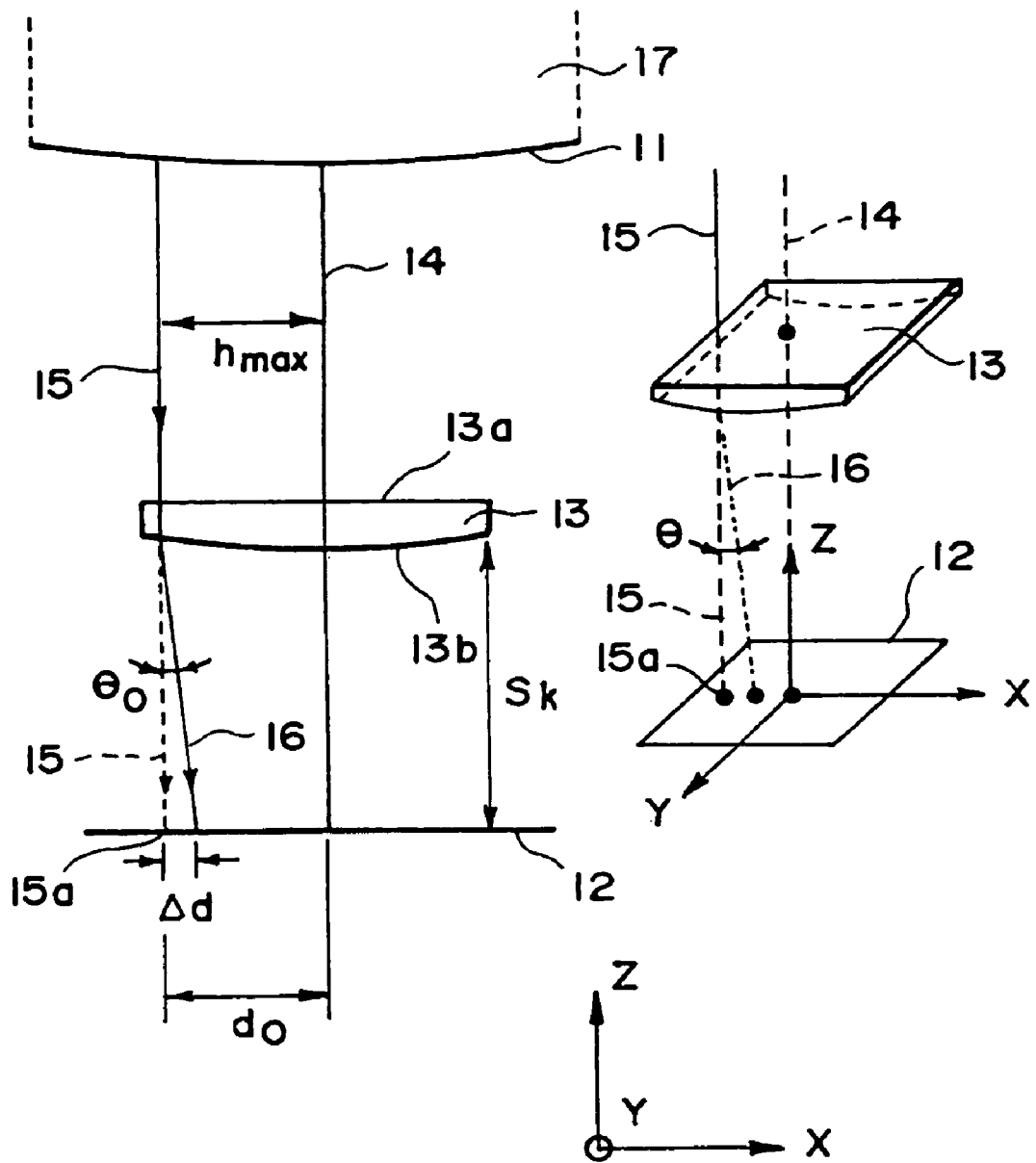
F I G. 1

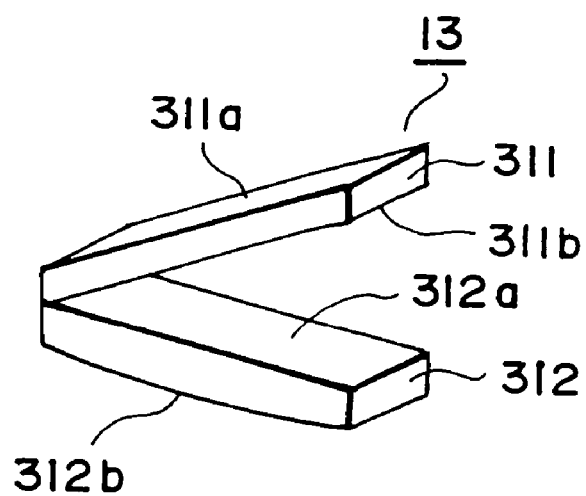
F I G. 3
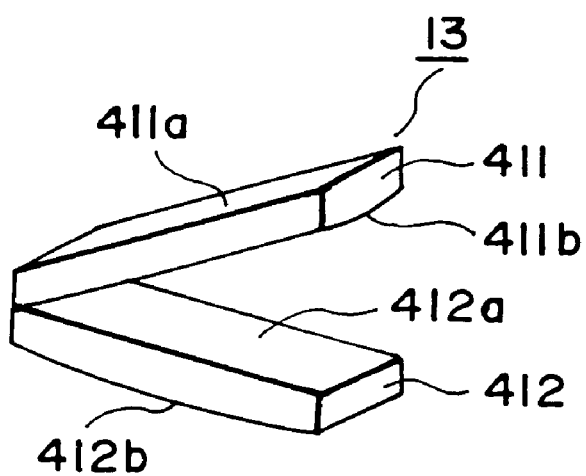
F I G. 4

ABERRATION CORRECTION OPTICAL SYSTEM

This application is a divisional application of copending U.S. patent application Ser. No. 09/438,491, filed Nov. 12, 1999.

FIELD OF THE INVENTION AND RELATED ART

This invention relates to an optical system for correcting aberration of a projection optical system, for use in a projection exposure apparatus (mask aligner) for manufacture of semiconductor devices, for example, to thereby assure better optical characteristics.

The need for higher density of a semiconductor device such as an IC or LSI has been increased more and more. In reduction type projection exposure apparatuses (steppers) wherein an image of a circuit pattern of a mask (reticle) is formed on a photosensitive substrate (wafer) through a projection optical system and the photosensitive substrate is exposed in accordance with a step-and-repeat method, or in reduction type projection exposure apparatuses (scanners) wherein a photosensitive substrate is exposed with a circuit pattern of a mask (reticle) in accordance with a step-and-scan method, many improvements have been attempted with respect to the resolution of a projection optical system and the precision of pattern registration for repeated projection exposures, printing different patterns upon the same region, to thereby meet the requirements of higher density integration.

In projection exposure apparatuses, the resolving performance of a projection optical system in relation to a pattern image as well as the pattern registration precision rely upon many factors such as optical performance of the projection optical system, stage precision, alignment precision, and so on. The optical performance of a projection optical system which directly concerns the registration precision involves a projection magnification error and distortion.

On the other hand, because of recent advancement in the optical design technique, it becomes possible to design a projection optical system having a large numerical aperture and a wide exposure region, yet with very small residual aberration.

Practically, however, a projection optical system for an exposure apparatus, as a product, will have aberrations attributable to errors in relation to an optical material or materials used, or to errors involved in the machining or assembling of optical systems, in addition to the residual aberration remaining in design. In consideration of this, in the manufacture of a projection optical system for an exposure apparatus, fine adjustments for various components are made after the assemblage is once completed, to minimize the aberration of the projection optical system due to any errors in manufacture, to a predetermined level.

Japanese Laid-Open Patent Application, Laid-Open No. 121816/1989, shows an example of fine adjustment of aberration of a projection system, wherein an aberration adjusting optical system comprising a light transmissive parallel flat plate is inserted onto an optical path between an image side of a projection optical system, having telecentricity, and an imaging plane thereof, to thereby adjust spherical aberration and on-axis coma aberration of the projection optical system. In this structure, the spherical aberration of the projection optical system can be adjusted by changing the thickness of the parallel flat plate, while the on-axis coma aberration can be adjusted by tilting the parallel flat plate.

Japanese Laid-Open Patent Application, Laid-Open No. 27743/1998, shows another example of fine adjustment of aberration of a projection system, wherein an aberration adjusting optical system is provided on an optical path between an image side of a projection optical system, having telecentricity, and an imaging plane thereof. The aberration adjusting optical system comprises two parallel flat plates having the same refractive index and the same thickness and being inclined with respect to an optical axis in opposite directions and by the same angle, means for changing the tilt angles of these two transparent flat plates in opposite directions and by the same amount, means for rotating the whole adjusting optical system integrally about the optical axis of the projection optical system, and means for tilting the whole adjusting optical system integrally in a desired direction. This aberration adjusting optical system adjusts spherical aberration, on-axis astigmatism, and on-axis coma aberration, individually.

On the other hand, a registration error in an exposure apparatus is produced as a consequence (D) of all of or a part of an alignment error component (A), an image distortion (distortion) error component (B), and a magnification error component (C). Among them, the alignment error component can be removed by relative positional adjustment (alignment) of a reticle and a wafer. However, the image distortion error component (B) and the magnification error component (C) can not be removed by the alignment adjustment. Thus, reduction of these imaging errors is strongly required for exposure apparatuses.

In regard to evaluation of an image distortion error component and a magnification error component such as described above, a component being isotropic around an optical axis of a projection optical system and being in first-order proportion to the distance in radial direction from the optical axis, is defined as a magnification error component. On the other hand, the image distortion component (B) can be classified into some components such as a third-order component (B1) proportional to a cube of "h", a fifth-order component (B2) being proportional to a fifth power of "h", and a component (aspect magnification error) (B3) concerning a difference in magnification between two orthogonal directions upon an image plane, for example.

Among these image distortion components, no aspect magnification error (B3) is produced, in design, in a projection optical system which is revolutionally symmetrical with respect to an optical axis. If, however, the surface of the product is not completely revolutionally symmetrical due to any errors in lens production, particularly in a case where the curvature radius of a lens changes along its circumferential direction, there occurs an aspect magnification difference (B3) as an ordinary image distortion component.

An aspect magnification error (B3) of a product projection optical system may be reduced by adjusting some lenses on the basis of: measuring the shapes of the surfaces of the lenses of the projection optical system by use of an interferometer, for example, and performing simulations for rotating the lenses about an optical axis so that the aspect magnification error and the on-axis astigmatism of the projection optical system can be minimized, in total, due to cancellation by the elements of the projection optical system. However, practically it is still difficult to suppress both of the aspect magnification error and the on-axis astigmatism, to a very low level at the same time.

Japanese Laid-Open Patent Application, Laid-Open No. 183190/1995, shows a projection exposure apparatus having an illumination optical system for illuminating a reticle and a projection optical system for projecting a pattern of the reticle, illuminated with the illumination optical system, onto a wafer at a predetermined reduction magnification. Optical means having a refracting power which is revolutionally asymmetrical with respect to an optical axis of the projection optical system, is disposed between the reticle and the wafer. This optical means is made rotatable about the optical axis of the projection optical system or it is made movable along the optical axis of the projection optical system, so as to correct any optical characteristic remaining in the projection optical system and being revolutionally asymmetrical with respect to the optical axis. However, on-axis coma aberration such as described above can not be corrected with this optical means.

SUMMARY OF THE INVENTION

It is an object of the present invention to provide an optical system by which on-axis coma aberration or an aspect magnification error can be corrected.

It is another object of the present invention to provide a projection exposure apparatus having such an optical system.

In accordance with a first aspect of the present invention, there is provided an aberration changing optical system for changing an aberration, characterized by an optical element having at least one of a cylindrical surface and a toric surface and being rotatable about and tiltable to an optical axis of said optical system.

In accordance with a second aspect of the present invention, there is provided an aberration changing optical system for changing an aberration, characterized by an optical element having different refracting powers in two orthogonal directions (or sectional planes) or having a refracting power only in one direction, said optical element being rotatable about and tiltable to an optical axis of said optical system.

In these aspects of the present invention, there may be a plurality of optical elements each being as aforesaid, and wherein said optical elements are selectively used.

There may be a second optical element having at least one of a cylindrical surface and a toric surface and being rotatable about and tiltable to the optical axis of said optical system integrally with the first-mentioned optical element, said second optical element further being tiltable in an opposite direction to the first-mentioned optical element.

There may be a parallel flat plate being rotatable about and tiltable to said optical axis of said optical system integrally with the optical element, said parallel flat plate further being tiltable in an opposite direction to said optical element.

The optical element may be mainly composed of a transparent material such as quartz or fluorite, for example.

The or each surface of said optical element, having a refracting power, may have a refractive power not greater than $3 \times 10^{-7}$ mm$^{-1}$.

In accordance with a third aspect of the present invention, there is provided a projection system, comprising: a projection optical system; and an aberration changing optical system as described above, for correcting an aberration to be produced in said projection optical system.

In accordance with a fourth aspect of the present invention, there is provided a projection exposure apparatus, comprising: an illumination system; and a projection system for projecting a pattern of a mask onto a substrate in cooperation with said illumination system, said projection system including a projection optical system and an aberration changing optical system, as described above, for correcting an aberration to be produced in said projection optical system.

In accordance with a fifth aspect of the present invention, there is provided a device manufacturing method, including a process for transferring a device pattern onto a wafer by use of a projection exposure apparatus as described above.

In accordance with a sixth aspect of the present invention, there is provided an optical system characterized by an optical element having at least one of a cylindrical surface and a toric surface and being inclined with respect to an optical axis.

In accordance with a seventh aspect of the present invention, there is provided an optical system characterized by an optical element having different refracting powers in two orthogonal directions (or sectional planes) or having a refracting power only in one direction, said optical element being inclined with respect to an optical axis.

In the sixth and seventh aspects of the present invention, described above, there may be a plurality of optical elements each being as aforesaid, and wherein said optical elements are selectively used.

Also, there may be a second optical element having at least one of a cylindrical surface and a toric surface and being inclined with respect to the optical axis and in an opposite direction to the first-mentioned optical element.

There may be a parallel flat plate being inclined with respect to the optical axis and in an opposite direction to said optical element.

The optical element may be mainly composed of a transparent material such as quartz or fluorite, for example.

The or each surface of said optical element, having a refracting power, may have a refractive power not greater than $3 \times 10^{-7}$ mm$^{-1}$.

In accordance with an eighth aspect of the present invention, there is provided a projection system, comprising: a projection optical system; and an optical system according to the sixth or seventh aspect of the present invention, for correcting an aberration to be produced in said projection optical system.

In accordance with a ninth aspect of the present invention, there is provided a projection exposure apparatus, comprising: an illumination system; and a projection system for projecting a pattern of a mask onto a substrate in cooperation with said illumination system, said projection system including a projection optical system and an optical system according to the sixth or seventh aspect of the present invention, for correcting an aberration to be produced in said projection optical system.

In accordance with a tenth aspect of the present invention, there is provided a device manufacturing method, including a process for transferring a device pattern onto a wafer by use of a projection exposure apparatus as described just above.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic view for explaining an aberration adjusting optical system according to an embodiment of the present invention.

FIG. 3 is a schematic view of an aberration adjusting optical system according to another embodiment of the present invention.

FIG. 4 is a schematic view of an aberration adjusting optical system according to a further embodiment of the present invention.

DESCRIPTION OF THE PREFERRED EMBODIMENTS

Figure 2:
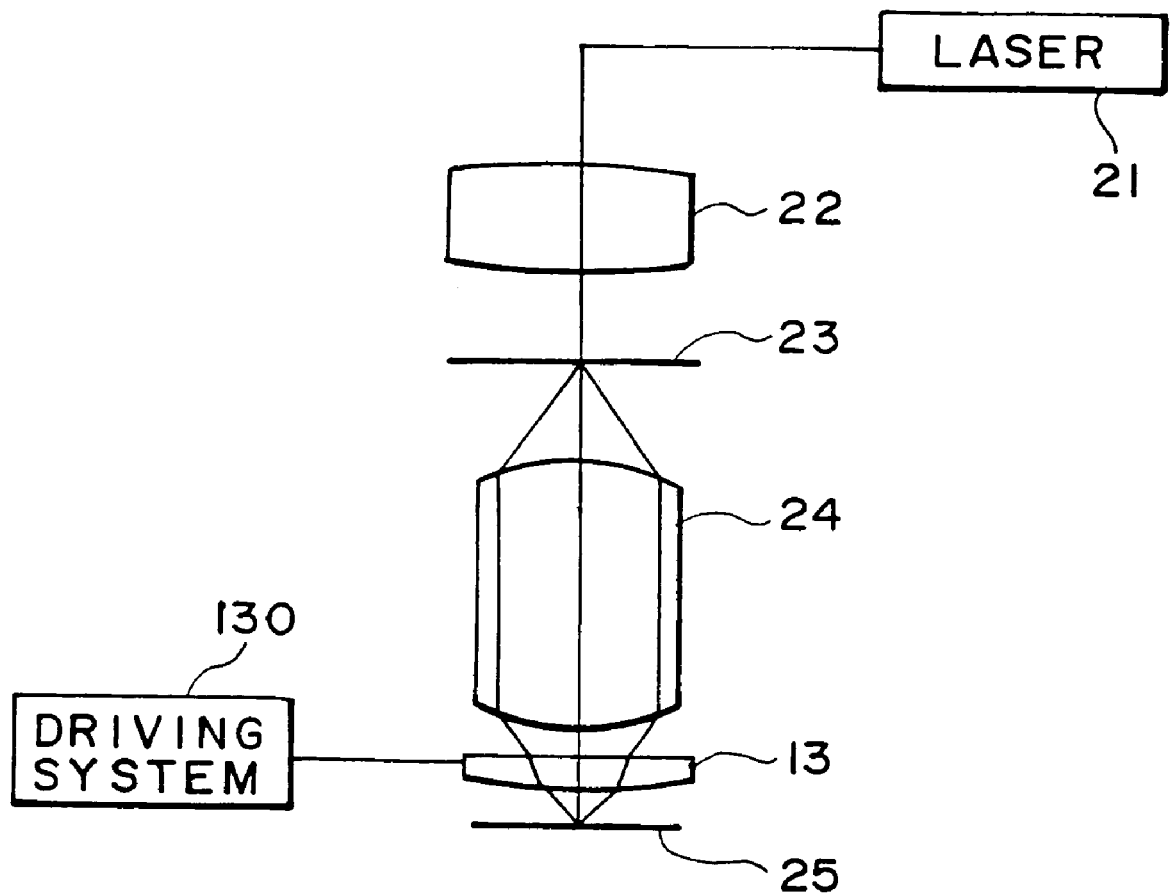
FIG. 2 is a schematic view of a projection exposure apparatus according to an embodiment of the present invention.

FIG. 1 is a schematic view of an aberration adjusting optical system according to a first embodiment of the present invention, and it shows optical paths in a portion of a projection system having such an aberration adjusting optical system.

As shown in FIG. 1, there is an aberration changing optical system 13 comprising an anamorphic optical element and being disposed between an image plane 12 of a projection optical system 17 and a lens 11, of the projection optical system 17, which is closest to the image plane thereof. The optical element 13 is rotatable about an optical axis and also is tiltable about an axis perpendicular to the optical axis. Also, the optical element 13 is mainly composed of a transparent material such as quartz or fluorite, for example, having a high transmission factor with respect to light of a wavelength greater than 250 nm.

In FIG. 1, the projection optical system 17 is telecentric on its image plane side, and the orientation of chief rays of imaging lights is parallel to an optical axis 14. A projection optical system of an exposure apparatus, for example, for use in the manufacture of semiconductor devices may preferably comprise such an optical system being telecentric on its exit side, to prevent a change in imaging magnification of a device pattern image, depending on the wafer surface position with respect to the optical axis direction.

In this embodiment, the aberration changing optical system includes an optical element 13 which has different refracting powers with respect to orthogonal directions. The optical element 13 is made rotatable about the optical axis, and also it is made tiltable about an axis perpendicular to the optical axis, by which any aspect magnification error of the projection system can be adjusted.

As regards the provision of the optical element with a refracting power only in one direction, a cylindrical surface or a diffractive surface such as a binary optics (BO) element may be used. The surface that applies a refracting power may be defined only on one surface of the optical element at the image side or object side thereof. Alternatively, both surfaces may be formed to have a refracting power in the same direction.

In a case where the aberration changing optical system 13 which comprises a single optical element (13) has a surface 13a, on the object side, and a surface 13b, on the image side, which are flat and are disposed in parallel to each other (i.e., a case of a parallel flat plate), a single chief ray 15 impinges at a reference position 12a upon the image plane 12, spaced from the optical axis 14 by a distance $d_0$.

The aberration changing optical system 13 of this embodiment is formed with an object side surface 13a being flat and an image side surface 13b of a cylindrical surface having a convex shape toward the image side and having a very large curvature radius r. The generating line of the cylindrical surface extends in a Y-axis direction. Thus, by rotating it around the optical axis and by tilting it about an axis parallel to the generating line and perpendicular to the optical axis, the aspect magnification difference can be changed, such that adjustment of aspect magnification of the projection system is accomplished.

When a chief ray 15 is refracted by the cylindrical surface 13b and where the largest image height of the projection optical system 17 is $h_{max}$ and the refractive index of the glass material (material) of the aberration changing optical system 13 is n, the angle $\theta_0$ of light emitted therefrom, with respect to the chief ray 15, can be expressed by the following equation:

$$\theta_0 \approx (n-1) \cdot h_{max}/r \tag{1}$$

Further, where the distance from the cylindrical surface 13b to the image plane 12 is $S_k$, the amount of shift $\Delta d$ of the imaging position, upon the image plane 12 as the chief ray 16 impinges on the image plane 12, from the reference position 12a thereon can be given by:

$$\Delta d \approx S_k \theta_0 \approx (n-1) \cdot S_k \cdot h_{max}/r \tag{2}$$

The shift amount $\Delta d$ above corresponds to a change in imaging magnification.

On the other hand, as regards the position of incidence, upon the image plane, of the chief ray with respect to the generating-line direction (Y direction) perpendicular to the direction (X direction) of the curvature r of the cylindrical surface 13b, since the chief ray is not refracted by the cylindrical surface 13b in the Y direction, it does not shift from the reference position 12a. Thus, no change occurs in the imaging magnification. In accordance with the principle described above, the imaging magnification can be changed only in the direction (X direction) in which the cylindrical surface 13b has a curvature, and thus correction of aspect magnification difference of the projection optical system 17 is accomplished.

In this embodiment, where the distance $S_k$ from the cylindrical surface 13b to the image plane is 36 mm, the largest image height $h_{max}$ of the projection optical system 17 is 15.6 mm, the refractive index n of the material of the aberration changing optical system 13 is 1.5, and the aspect magnification difference (a difference at the largest image height position) which can be adjusted through the aberration adjusting optical system 13 is 0.05 micron, then, from equation (2), the curvature radius r required for the cylindrical surface 13b is about $5.0 \times 10^6$ mm.

Here, the refracting power $\phi$ to a light ray passing through the cylindrical surface 13b can be given by the following equation:

$$\phi = |(n-r)/r| \tag{3}$$

The refracting power $\phi$ above takes a positive value only, as a common definition for the light entrance side surface and the light exit side surface of the aberration changing optical system 13. The refracting power of the cylindrical surface 13b in the above-described embodiment is, from equation (3), $\phi = 1.0 \times 10^{-7}$ mm$^{-1}$. If the refracting power $\phi$ is sufficiently small, an additional aberration amount other than the aspect magnification difference through the aberration changing optical system 13 is small, such that there occurs no problem in practice. If, on the other hand, the refracting power φ becomes larger than φ=3.0×10$^{-7}$ mm$^{-1}$, the addition of other aberration through the aberration changing optical system 13 becomes notable and can not be disregarded. Therefore, preferably a condition φ≦3.0×10$^{-7}$ mm$^{-1}$ should be satisfied.

On the other hand, it will be readily understood that, even if the refracting power is sufficiently weak, not only the aspect magnification difference but also other aberrations such as a spherical aberration, which are influential to the imaging characteristic, are produced due to the aberration changing optical system 13. Therefore, it is necessary to design the projection optical system 17 while taking into account the influence of the aberration changing optical system 13. Further, in consideration of the property that the spherical aberration of the projection optical system 17 depends on the thickness of the aberration changing optical system 13, the spherical aberration of the projection optical system 17 as a product may be measured in practice and then a best thickness of the aberration changing optical system 13 may be determined. Further, the on-axis coma aberration of the projection optical system 17 may be measured and, on the basis of the result thereof, a best tilt angle of the aberration changing optical system 13 may be determined. Then, by tilting the aberration changing optical system 13 about an axis orthogonal to the optical axis, the on-axis coma aberration can be adjusted.

FIG. 2 illustrates an optical arrangement having an aberration adjusting optical system according to an embodiment of the present invention, wherein the optical system of the present invention is incorporated into a projection exposure apparatus for semiconductor device manufacture. This embodiment can be applied to a projection exposure apparatus of either a step-and-repeat type or a step-and-scan type.

Denoted in FIG. 2 at 21 is a light source which comprises a laser such as an excimer laser. Denoted at 22 is an illumination optical system for uniformly illuminating a reticle 23 (surface to be illuminated) with light from the light source 21. Denoted at 23 is a reticle, and denoted at 24 is a projection lens for projecting a pattern of the reticle 23 onto a wafer 24 in a reduced scale. Denoted at 25 is the surface of the wafer which is placed on the image plane.

There is an aberration changing optical system 13 such as described with reference to FIG. 1, which is disposed between the projection lens 24 and the wafer 25. The aberration changing optical system 13 can be rotated around the optical axis and also tilted about any axis orthogonal to the optical axis, by means of a driving system 130 or manually. With this structure, aberrations of the mask projecting system including the projection optical system 24 and the optical system 13 can be adjusted.

FIG. 3 is a schematic view of a main portion of an aberration changing optical system according to a second embodiment of the present invention. In this embodiment, the aberration changing optical system 13 comprises two optical elements 311 and 312 having the same refractive index and the same thickness and being inclined with respect to the optical axis by the same angle but in opposite directions.

The first optical element 311 placed at the object side has a surface 311a on the object side and a surface 311b on the image side which are flat and are disposed in parallel to each other. The second optical element 312 placed at the image side has a flat surface 312a on the image side and a cylindrical surface 312b, on the image side, of convex shape facing toward the image side.

Further, there are first rotating means for rotationally moving the second optical element 312, having a protruded cylindrical shape on one surface thereof, about an axis perpendicular to its flat surface 312a, and first tilting means for changing the tilt angles of the two optical elements 311 and 312 in opposite directions but by the same amount. Additionally, there are second rotating means for rotationally moving the whole aberration changing optical system 13 integrally about the optical axis of the projection optical system, and second tilting means for tilting the whole aberration changing optical system integrally in a desired direction.

With use of the aberration changing optical system of this embodiment, in addition to the aspect magnification error, other aberrations such as a spherical aberration, an on-axis coma aberration and an on-axis astigmatism, for example, can be adjusted.

More specifically, the aspect magnification error can be adjusted in accordance with the same principle as in the first embodiment. The spherical aberration can be adjusted by changing the central thickness of the two optical elements 311 and 312, by changing one by another. The on-axis astigmatism can be adjusted by rotating the aberration changing optical system 13 as a whole integrally, about the optical axis of the projection optical system, and by changing the tilt angles of the two optical elements 311 and 312 in opposite directions and by the same amount. Further, the on-axis coma aberration can be adjusted by tilting the aberration changing optical system 13 integrally.

An example of aspect magnification error adjustment through the optical system 13 of this embodiment, will be explained with reference to FIG. 1 and in respect to specific numerical data.

In this example, the distance $S_k$ from the cylindrical surface 312b to the image plane is 36 mm, the largest image height $h_{max}$ of the projection optical system is 15.6 mm, the refractive index n of the materials of the optical elements 311 and 312 is 1.5, and the aspect magnification difference at the largest image height position which can be adjusted by the aberration changing optical system 13 of this embodiment is 0.05 micron. The required curvature radius r of the cylindrical surface 312b can be calculated in accordance with equation (2), as in the first embodiment, and it is about 5.0×10$^6$ mm.

In a case where the central thickness of the two optical elements 311 and 312 of the aberration changing optical system 13, in the optical axis direction, is 8 mm, the air spacing between the two optical elements 311 and 312 is 2 mm, the exposure wavelength is 248 nm, and the numerical aperture of the projection optical system 17 is 0.6, and when the tilt angles of the two optical elements 311 and 312 are changed in opposite directions by 10', respectively, the on-axis astigmatism of the projection optical system changes by about 0.06 micron.

While this embodiment has been described with reference to an example where the first optical element 311 of the aberration changing optical system comprises a parallel flat plate and the second optical element 312 thereof has a one-side cylindrical surface, the invention is not limited to this. The first optical element may have a cylindrical surface on one side thereof, and the second optical element may comprise a parallel flat plate.

FIG. 4 is a schematic view of a main portion of an aberration changing optical system according to a third embodiment of the present invention. In this embodiment, the aberration changing optical system 13 comprises two optical elements 411 and 412 having the same refractive index and the same central thickness and being tilted with respect to the optical axis, in opposite directions and by the same angle.

The first optical element 411 placed on the object side has a flat surface 411a on the object side and a cylindrical surface 411b, on the image side, of convex shape facing toward the image side. Similarly, the second optical element 412 placed on the image side has a flat surface 412a on the object side and a cylindrical surface 412b, on the image side, of convex shape facing toward the image side.

The aberration changing optical system 13 of this embodiment is provided with first rotating means for rotationally moving these two optical elements 411 and 412 about axes perpendicular to their flat faces 411a and 412a, respectively, and first tilting means for changing the tilt angles of the two optical elements in opposite directions but by the same amount. Additionally, there are second rotating means for rotationally moving the whole aberration changing optical system 13 integrally, about the optical axis of the projection optical system, and second tilting means for tilting the whole aberration changing optical system integrally, in a desired direction.

With the aberration changing optical system of this embodiment, by rotating the first optical element 411 about an axis perpendicular to its flat surface 411a and by rotating the second optical element 412 about an axis perpendicular to its flat surface 412a, respectively, a change in magnitude and direction of the aspect magnification difference can be adjusted.

More specifically, as the direction in which the cylindrical surface 411b of the first optical element 411 has a curvature is brought into registration with the direction in which the cylindrical surface 412b of the second optical element 412 has a curvature, the amount of change in aspect magnification difference becomes maximum. If it is made orthogonal to the direction in which the cylindrical surface 412b of the second optical element 412 has a curvature, the amount of change in aspect magnification difference becomes smallest.

An example of adjustment of an aspect magnification error in this embodiment will be described with reference to FIG. 1 and in respect to specific numerical data.

In this example, simulations were made with the conditions that: the exposure wavelength is 248 nm, the numerical aperture of the projection optical system is 0.6, the central thickness of the two optical elements 411 and 412 of the aberration changing optical system in the optical axis direction is 8 mm, the air spacing between the two optical elements 411 and 412 is 2 mm, the curvature radius of the cylindrical surface 411b of the first optical element 411 is $6.0 \times 10^6$ mm, the curvature radius of the cylindrical surface 412b of the second optical element 412 is $5.0 \times 10^6$ mm, the distance $S_k$ from the cylindrical surface 412b of the second optical element 412 to the image plane is 36 mm, the largest image height $h_{max}$ of the projection optical system is 15.6 mm, the refractive index n of the materials of the optical elements 411 and 412 is 1.5.

As a result, it has been confirmed that, when the direction in which the cylindrical surface 411b of the first optical element 411 has a curvature and the direction in which the cylindrical surface 412b of the second optical element 412 has a curvature, are placed orthogonal to each other, the aspect magnification difference imparted by the aberration changing optical system becomes equal to zero.

On the other hand, when the first optical element 411 and/or the second optical element 412 is rotated about an axis perpendicular to its flat surface so that the direction in which the cylindrical surface 411b of the first optical element 411 has a curvature and the direction in which the cylindrical surface 412b of the second optical element 412 has a curvature are brought into registration with each other, the amount of aspect magnification difference imparted by the aberration changing optical system 13 becomes maximum. The amount of change thereof at the largest image height position is 0.11 micron.

The angle defined between the direction in which the cylindrical surface 411b of the first optical element 411 has a curvature and the direction in which the cylindrical surface 412b of the second optical element 412 has a curvature, can be adjusted as desired. Here, the aspect magnification difference to be imparted by the aberration changing optical system varies continuously from zero to a maximum. Thus, within a range from zero to an adjustable largest value, the aspect magnification difference in a desired amount and direction to be produced by the projection optical system can be adjusted through the aberration changing optical system of this embodiment. Further, like the second embodiment, the spherical aberration, the on-axis coma aberration and the on-axis astigmatism of the projection optical system can be adjusted independently of each other, as desired.

Although the foregoing embodiments have been described with reference to a case where the image side surface of an optical element, constituting the aberration changing optical system, has a refracting power, the invention is not limited to this form. The object side surface may have a refracting power, or both of the object side surface and the image side surface may have a refracting power in the same direction.

Providing a refracting power in one direction of the optical element is not limited to use of a smooth cylindrical surface shape. A diffractive optical element such as a binary optics (BO) having a one-dimensional refracting power may be used, for example.

Alternatively, an anamorphic optical system having different refracting powers in X and Y directions may be used for the aberration changing optical system. As regards the central thickness of the optical element used in the aberration changing optical system, if it is not greater than 5 mm, any additional aberration will be produced due to the influence of weight deformation of the optical element. If it is not less than 30 mm, there will occur absorption of exposure light by the optical element. Thus, preferably it may be in a range from 5 mm to 30 mm. Further, in a case where the aberration changing optical system comprises plural optical elements, in order to avoid Newton's rings resulting from interference of light inside the optical system, an air spacing of 0.1 mm or more should preferably be maintained between adjacent optical elements.

Further, the specifications of a projection optical system having an aberration changing optical system of the present invention incorporated therein, such as the exposure wavelength and the numerical aperture, for example, are not limited to those described hereinbefore.

Next, an embodiment of a device manufacturing method which uses an exposure apparatus having a projection optical system with an aberration changing optical system, according to any one of the preceding embodiments, will be explained.

Figure 5:
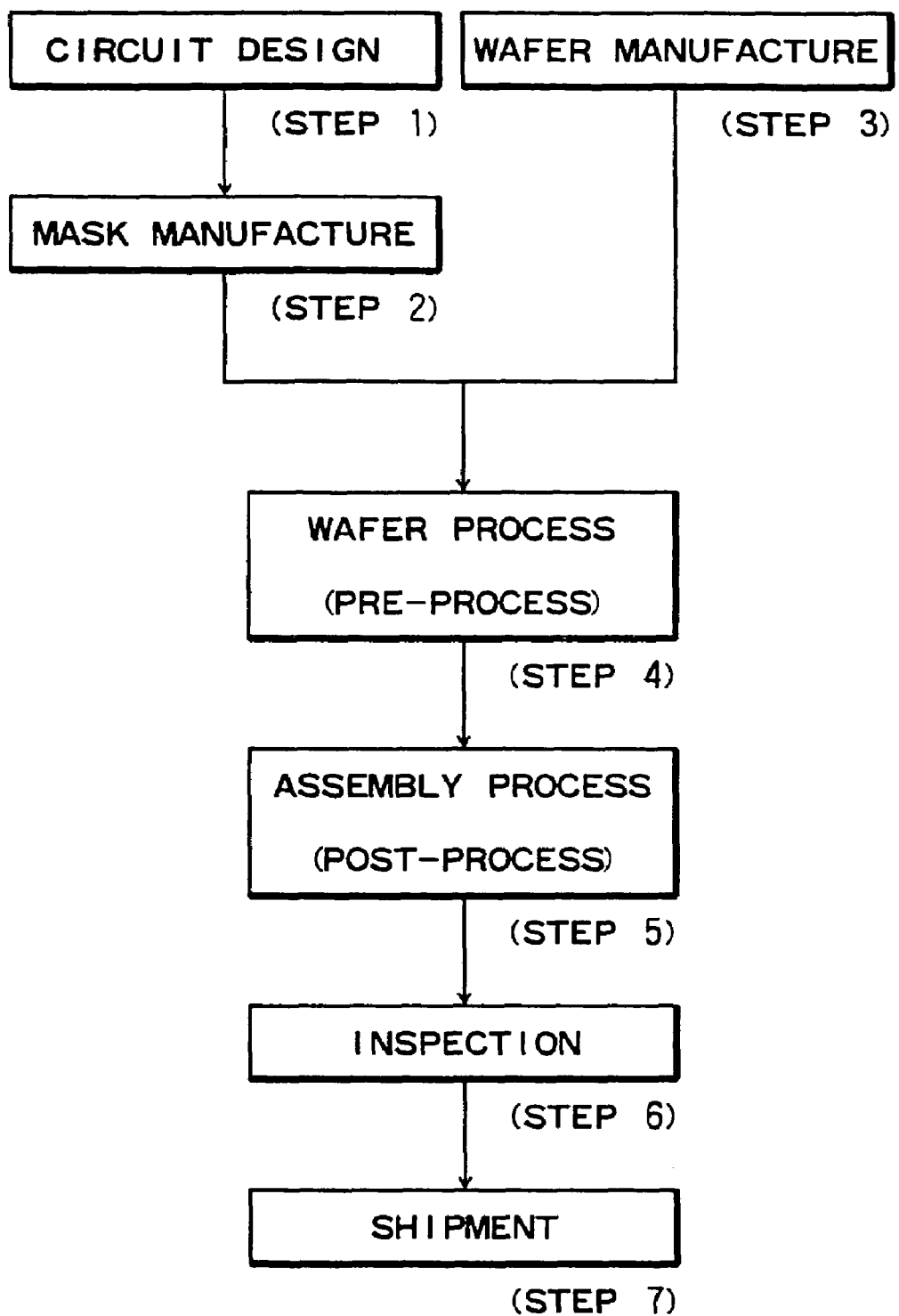
FIG. 5 is a flow chart of semiconductor device manufacturing processes.

FIG. 5 is a flow chart of a procedure for the manufacture of microdevices such as semiconductor chips (e.g., ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon.

Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 6:
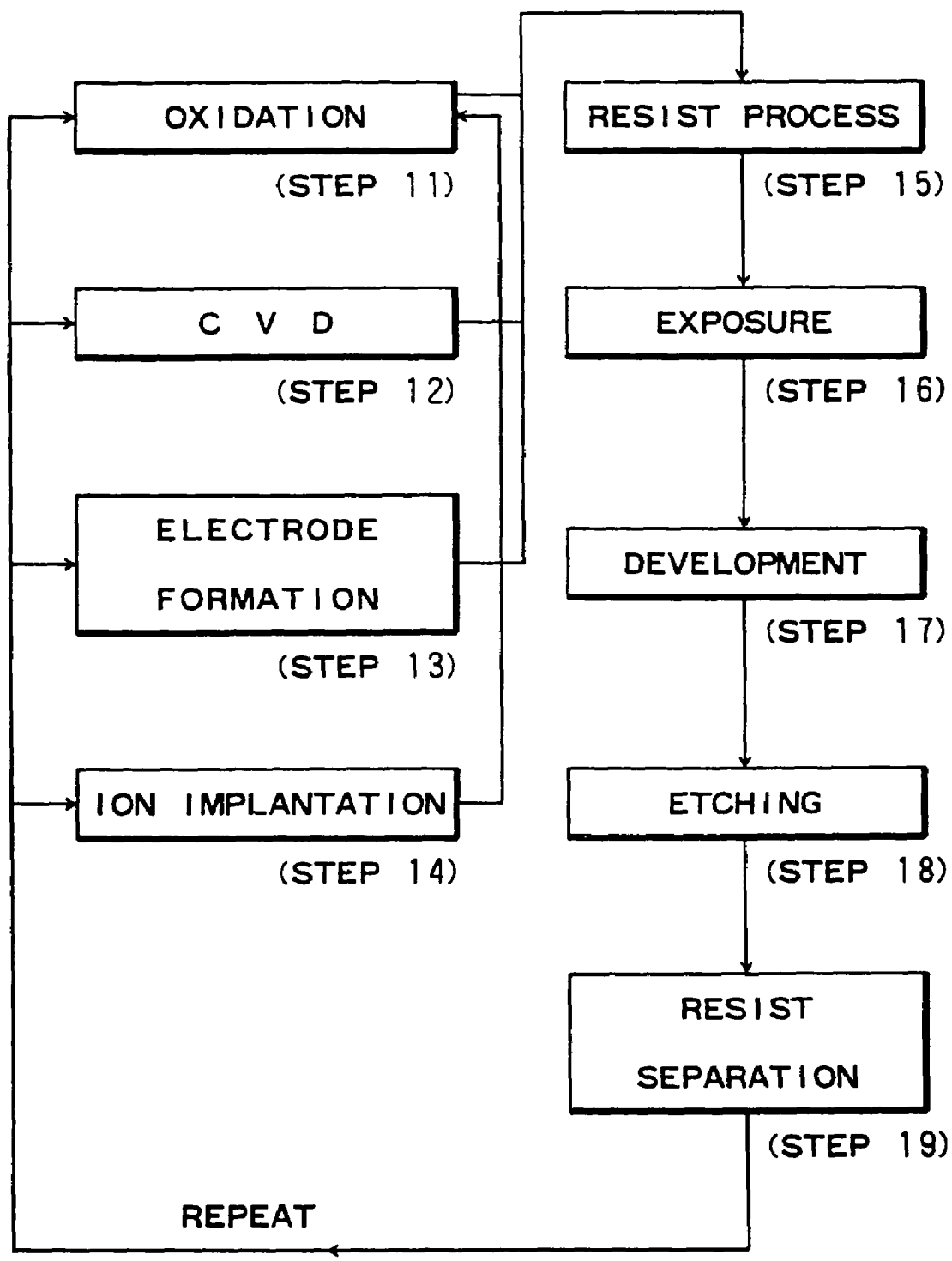
FIG. 6 is a flow chart for explaining details of a wafer process, included in the procedure of FIG. 5.

FIG. 6 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A projection system for projecting a pattern of a mask onto a substrate, said projection system comprising:
    a projection optical system disposed between the mask and the substrate; and
    a pair of optical elements for correcting aberration produced in said projection optical system, at least one of said pair of optical elements having different refracting powers in two orthogonal directions or having a refracting power in one direction of two orthogonal directions and no refracting power in the other of the two orthogonal directions, and said pair of optical elements being disposed between the mask and the substrate, wherein an optical axis of at least one of said pair of optical elements is inclined with respect to an optical axis of said projection optical system and said pair of optical elements are made rotatable and tiltable integrally and further tiltable in mutually opposite directions.

2. A projection system for projecting a pattern of a mask onto a substrate, said projection system comprising:
    a projection optical system disposed between the mask and the substrate;
    an optical element for correcting aberration produced in said projection optical system, said optical element having different refracting powers in two orthogonal directions or having a refracting power in one direction of two orthogonal directions and no refracting power in the other of the two orthogonal directions, and said optical element being disposed between the mask and the substrate, wherein an optical axis of said optical element is inclined with respect to an optical axis of said projection optical system; and
    a parallel flat plate being inclined with respect to the optical axis and in an opposite direction to said optical elements.

* * * * *